United States Patent
Tam

(10) Patent No.: US 6,552,577 B1
(45) Date of Patent: Apr. 22, 2003

(54) DIFFERENTIAL EMITTER-COUPLED LOGIC BUFFER HAVING REDUCED POWER DISSIPATION

(75) Inventor: Kimo Y. F. Tam, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/505,087

(22) Filed: Feb. 16, 2000

(51) Int. Cl.[7] .................................. H03K 19/086
(52) U.S. Cl. ...................... 326/126; 326/18; 326/26; 326/89; 327/170; 327/205
(58) Field of Search ............................. 326/75, 77, 78, 326/126, 89; 330/252–255, 262–264

(56) References Cited

U.S. PATENT DOCUMENTS

| | | | | |
|---|---|---|---|---|
| 4,678,942 A | * | 7/1987 | Kanai et al. ................... 326/89 |
| 4,943,741 A | * | 7/1990 | Estrada et al. ............... 326/126 |
| 5,043,602 A | * | 8/1991 | Flannagan ................... 326/126 |
| 5,101,124 A | * | 3/1992 | Estrada ........................ 326/126 |
| 5,767,702 A | * | 6/1998 | Hense et al. ................. 326/126 |

* cited by examiner

Primary Examiner—Michael Tokar
Assistant Examiner—Vibol Tan
(74) Attorney, Agent, or Firm—Iandiorio & Teska

(57) ABSTRACT

A logic buffer includes a logic gate having at least two input terminals and two output nodes, a plurality of output terminals, each having a capacitance associated therewith and a pull-up circuit interconnected between each output node and the plurality of output terminals for alternately charging the capacitance of each output terminal. The buffer also includes a differential pull-down circuit including a common pull-down current source, the pull-down device interconnected between the output nodes and the output terminals for inversely alternately discharging the capacitances through the common pull-down current source for accelerating the discharge of the capacitance of the respective output terminal.

26 Claims, 10 Drawing Sheets

US 6,552,577 B1

DIFFERENTIAL EMITTER-COUPLED LOGIC BUFFER HAVING REDUCED POWER DISSIPATION

FIELD OF INVENTION

This invention relates generally to a differential emitter-coupled logic buffer having reduced power dissipation, and more particularly to a logic buffer having a differential emitter-coupled pull-down circuit which increases the discharge rate of differential outputs of the logic buffer.

BACKGROUND OF INVENTION

Emitter-coupled logic (ECL) buffers use resistor-loaded, common-emitter differential pairs to realize combinatorial functions such as NOR and NAND. Emitter-follower buffer circuits are appended to the outputs of the differential pairs to perform level shifting and to allow the gate to drive large capacitive loads without drastically increasing the gate delay and output rise and fall times. ECL buffers inherently produce both true and complement outputs. Often, a pair of emitter followers is used to transmit the differential signals to preserve signal fidelity while transmitting the output of the buffer to a remote receiver.

However, prior art emitter-follower buffers which drive large capacitive loads typically suffer from asymmetrical rising and failing edges of the output signals. In the typical case of an NPN emitter follower, the output rising edge can be very fast since the drive current from the pull-up circuit, which operates common collector, increases substantially (limited only by its base current), whereas during the output falling edge, the pull-up circuit turns off and the edge rate is limited by the fixed drive current of the pull-down circuit, which is typically a current source or resistor.

The asymmetric output rise and fall times have the additional undesirable effect of causing the propagation delay to depend on whether the data is rising or falling. To speed up the falling edge, the quiescent current in the pull-down circuit must be increased at the expense of power dissipation. This current is wasted during the rising transition. In a typical ECL buffer having an emitter follower which must drive a heavy capacitive load, the power dissipation and gate delay are dominated by the output buffer rather than the logic gate function. A differential ECL gate suffers doubly since it has two emitter followers.

One example of a prior art ECL buffer includes a differential device having differential inputs and corresponding differential outputs. Each differential output is coupled to a voltage source through a pull-up transistor and to a reference voltage through a current source. The base of each of the pull-up transistors is connected to an output node of the differential device for controlling the operation of the pull-up transistor. When a logic high is present at the base of the pull-up transistor, the pull-up transistor is turned on and the associated output terminal is charged. When the voltage at the base of the pull-up transistor is at a logic low, the transistor is turned off and the output terminal is discharged through the current source. However, because the current source is always on, it is always dissipating power regardless of whether or not the output terminal is being discharged. In other words, even when the output terminal is being charged through the pull-up transistor, the current source is dissipating power. Furthermore, due to the fixed current generated by the current source, the output terminal is discharged at a slower rate than the rate at which it is charged by the pull-up transistor. An increase in the amplitude of the current source in order hasten the discharge times results in additional power dissipation when the output terminal is not being discharged.

Another prior art ECL gate includes a PNP transistor in the place of the current source of the gate described above for discharging the output terminal. However, while this gate reduces power dissipation by not using a current source for discharging the output terminal, the overall circuit requires additional transistors for proper operation of the PNP transistor, and PNP transistors, by their nature, are much slower than similarly sized NPN transistors.

Yet another prior art ECL gate includes a pull-down device having a number of NPN transistors and capacitors which must be properly tuned to increase the symmetry between the rising and falling edges of the voltage at the output terminal. However, this prior art device requires a large area to implement the capacitors and an increased number of transistors and, due to the tuning required for the circuit to operate properly, the circuit is much more complex to maintain in proper operating condition.

BRIEF SUMMARY OF THE INVENTION

It is therefore an object of this invention to provide an emitter-coupled logic buffer having reduced power dissipation.

It is a further object of this invention to provide such an emitter-coupled logic buffer with reduced output load discharge times.

It is a further object of this invention to provide an emitter-coupled logic buffer having symmetrical rising and falling edges of the output voltage.

It is a further object of this invention to provide such an emitter-coupled logic buffer which eliminates the need for fast complementary devices such as PNP transistors.

It is a further object of this invention to provide such an emitter-coupled logic buffer having a reduced number of transistors.

The invention results from the realization that a low-power, symmetrical emitter-coupled logic buffer can be achieved by using an emitter-coupled pair of transistors as a differential pull-down circuit for alternately discharging output loads through a common discharge path.

This invention features a logic buffer including a logic gate having at least two input terminals and two output nodes, a plurality of output terminals, each having a capacitance associated therewith and a pull-up circuit interconnected between each output node and the plurality of output terminals for alternately charging the capacitance of each output terminal. The buffer also includes a differential pull-down circuit including a pull-down current source, the pull-down circuit interconnected between the output nodes and the output terminals for inversely alternately discharging the capacitances through the pull-down current source for accelerating the discharge of the capacitance of the respective output terminal.

In a preferred embodiment, the differential pull-down circuit may include a plurality of emitter-coupled transistors, each being electrically connected to one of the plurality of output terminals, the emitters of each of the transistors being electrically connected to the common pull-down current source. The buffer may include first and second output terminals and the logic gate may include a differential device having first and second differential input terminals and first and second differential output nodes. The pull-up circuit may include a first transistor electrically connected between the first output node and the first output terminal for charging the capacitance of the first output terminal, and a second transistor electrically connected between the second output node and the second output terminal, for charging the capacitance of the second output terminal. The differential pull-down circuit may include third and fourth emitter-coupled transistors, the third transistor being electrically connected to the first output terminal for discharging the capacitance of the first output terminal, and the fourth transistor being electrically connected to the second output terminal for discharging the capacitance of the second output terminal, the emitters of the third and fourth transistors being electrically connected to a reference voltage source through the common pull-down current source. The differential pull-down circuit may further include a fifth transistor electrically connected between the first output node and the fourth transistor, for controlling the state of the fourth transistor, and a sixth transistor electrically connected between the second output node and the third transistor, for controlling the state of the third transistor. The differential pull-down circuit may further include a first diode electrically connected between the fourth and fifth transistors and a second diode electrically connected between the third and sixth transistors. A base terminal of the first transistor may be electrically connected to an emitter terminal of the fifth transistor, a base terminal of the second transistor may be electrically connected to an emitter terminal of the sixth transistor and the common current source may be a fixed current source. The differential pull-down circuit may include a plurality of semiconductor switches, each having a control terminal, a first terminal and a second terminal, each of the semiconductor switches being electrically connected to one of the plurality of output terminals, the second terminals of each of the semiconductor switches being electrically connected to the common pull-down current source. The pull-up circuit may include a first semiconductor switch electrically connected between the first output node and the first output terminal for charging the capacitance of the first output terminal and a second semiconductor switch electrically connected between the second output node and the second output terminal, for charging the capacitance of the second output terminal. The differential pull-down circuit may include third and fourth semiconductor switches each having first and second terminals, the third transistor having its first terminal electrically connected to the first output terminal for discharging the capacitances of the first output terminal. The fourth transistor may have its first terminal electrically connected to the second output terminal for discharging the capacitance of the second output terminal, and the second terminal of the third and fourth transistors may be electrically connected together and to a reference voltage source through the common pull-down current source. The differential pull-down circuit may further include a fifth semiconductor switch electrically connected between the first output node and the fourth semiconductor switch, for controlling the state of the fourth semiconductor switch and a sixth semiconductor switch electrically connected between the second output node and the third semiconductor switch, for controlling the state of the third semiconductor switch. The differential pull-down circuit may further include a first diode electrically connected between the fourth and fifth semiconductor switches and a second diode electrically connected between the third and sixth semiconductor switches. A control terminal of the first semiconductor switch may be electrically connected to a terminal of the fifth semiconductor switch and a control terminal of the second semiconductor switch may be electrically connected to a terminal of the sixth semiconductor switch. Each of the capacitances may be associated with a load coupled to each of the plurality of output terminals or associated with parasitic loads at each of the plurality of output terminals.

This invention also features a logic buffer including a logic gate having at least two input terminals and two output nodes, a plurality of output terminals, each having a capacitance associated therewith and a pull-up circuit electrically connected between each of the output nodes and the plurality of output terminals for selectively charging the capacitance of each output terminal. A pull-down circuit is electrically connected between each of the output nodes and the plurality of output terminals for selectively discharging the capacitances of each of the output terminals through a single discharge path. The pull-up circuit and the pull-down circuit cooperate to alternately charge and discharge the capacitances of each of the output terminals.

In a preferred embodiment, the pull-down circuit may include a plurality of emitter-coupled transistors, each transistor being electrically connected to one of the plurality of output terminals, the emitters of each of the transistors being electrically connected to the single discharge path. The single discharge path may include a fixed current source. The buffer may include first and second output terminals and the logic gate may include a differential device having first and second differential input terminals and first and second differential output nodes. The pull-up circuit may include a first transistor electrically connected between the first output node and the first output terminal for charging the capacitance of the first output terminal, and a second transistor electrically connected between the second output node and the second output terminal, for charging the capacitance of the second output terminal. The differential pull-down circuit may include third and fourth emitter-coupled transistors, the third transistor being electrically connected to the first output terminal for discharging the capacitance of the first output terminal, and the fourth transistor being electrically connected to the second output terminal for discharging the capacitance of the second output terminal, the emitters of the third and fourth transistors being electrically connected to a reference voltage source through the common pull-down current source. The differential pull-down circuit may further include a fifth transistor electrically connected between the first output node and the fourth transistor, for controlling the state of the fourth transistor, and a sixth transistor electrically connected between the second output node and the third transistor, for controlling the state of the third transistor. The differential pull-down circuit may further include a first diode electrically connected between the fourth and fifth transistors and a second diode electrically connected between the third and sixth transistors. A base terminal of the first transistor may be electrically connected to an emitter terminal of the fifth transistor, a base terminal of the second transistor may be electrically connected to an emitter terminal of the sixth transistor and the common current source may be a fixed current source.

BRIEF DESCRIPTION OF THE DRAWINGS

Other objects, features and advantages will occur to those skilled in the art from the following description of a preferred embodiment and the accompanying drawings, in which.

DETAILED DESCRIPTION OF THE DRAWINGS

Figure 1:
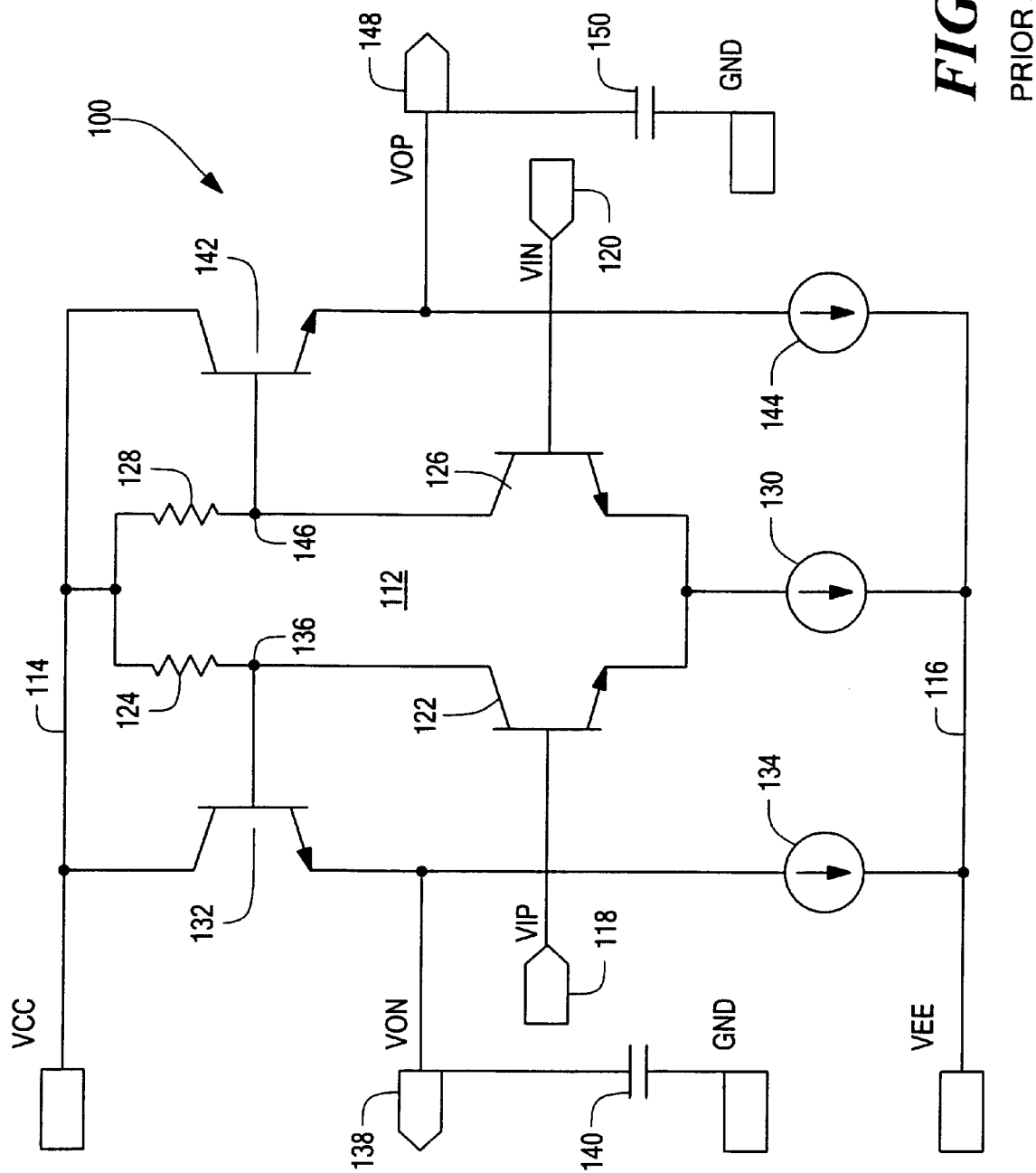
FIG. 1 is a schematic drawing of a prior art emitter-coupled logic buffer.

FIG. 1 shows a prior art ECL buffer 100 with differential emitter-follower outputs. Buffer 100 includes a differential device 112 which is coupled between a voltage source 114 and a reference voltage 116 and has complementary inputs 118 and 120. Device 112 includes a first input transistor 122 having its base coupled to input 118 and its collector coupled to the voltage source 114 through a resistor 124, and a second input transistor 126 having its base coupled to input 120 and its collector coupled to the voltage source 114 through a resistor 128. The emitters of transistors 122 and 126 are coupled together and to the reference voltage 116 through a current source 130. An emitter follower transistor 132 is coupled between voltage source 114 and reference voltage 116 through current source 134 and has its base coupled to output node 136 and its emitter coupled to output terminal 138 and to capacitive load 140. A second emitter follower transistor 142 is coupled between the voltage source 114 and reference voltage 116 through a current source 144, its base is coupled to an output node 146, and its emitter is coupled to an output terminal 148 and to a capacitive load 150.

Figure 2:
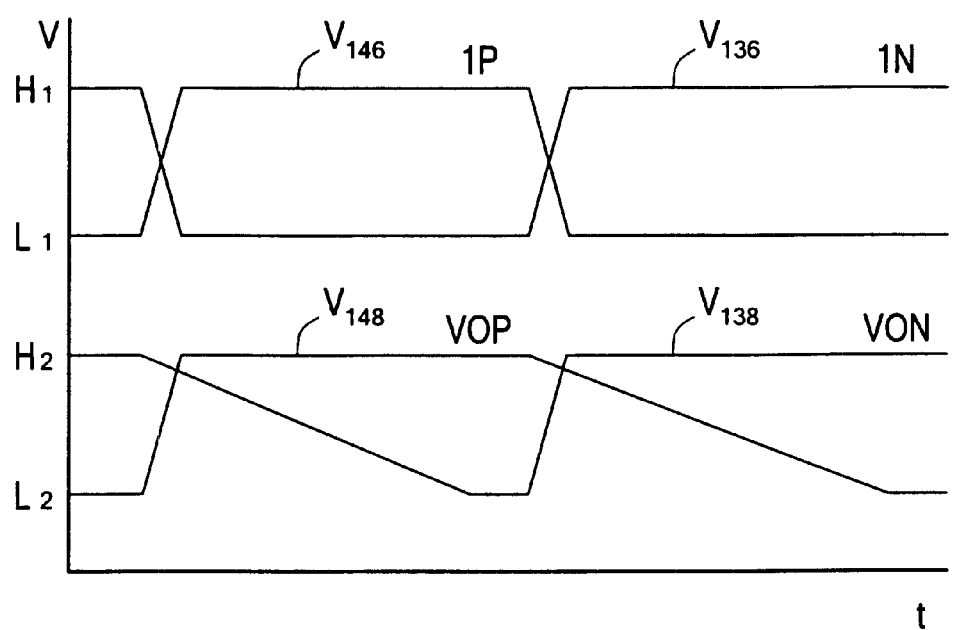
FIG. 2 is a graph that shows the voltages of the output terminals of the emitter-coupled logic buffer of FIG. 1.

The operation of the gate 100 will now be described with reference FIG. 2 which is a graph of the voltages $V_{136}$ and $V_{146}$ which correspond to the voltages at output nodes 136 and 146, respectively, and voltages $V_{138}$ and $V_{148}$, which correspond to the output voltages at output terminals 138 and 148, respectively. Upon the transition of the input signal applied at input terminal 118 from a low level to a high level, the voltage at output node 146 rises from a low level to a high level. The voltage $V_{146}$ at output node 146 turns on emitter follower transistor 142 which thereby "pulls up" the output node 148 by charging capacitive load 150. Conversely, as the voltage at input terminal 118 is increasing from a low level to a high level, the voltage at input terminal 120 is decreasing from a high level to a low level, causing the voltage at output node 136 to also decrease from a high level to a low level, causing the voltage at output node 136 to also decrease from the high level to the low level, thereby turning off emitter follower transistor 132. Since the current is no longer being transferred to the output terminal 138 through emitter follower transistor 132, current source 134 acts to discharge capacitive load 140, thereby "pulling down" the output terminal 138. However, due to the limited capacity of the current source 134, the voltage $V_{138}$ at output terminal 138 can only discharge through the current source 134 at a fixed rate which is much slower than the rate at which the output terminal 148 can be charged up, thereby resulting in asymmetry between the rising and falling edges of the voltages $V_{138}$ and $V_{148}$, at the output terminals 138 and 148 respectively.

Figure 3:
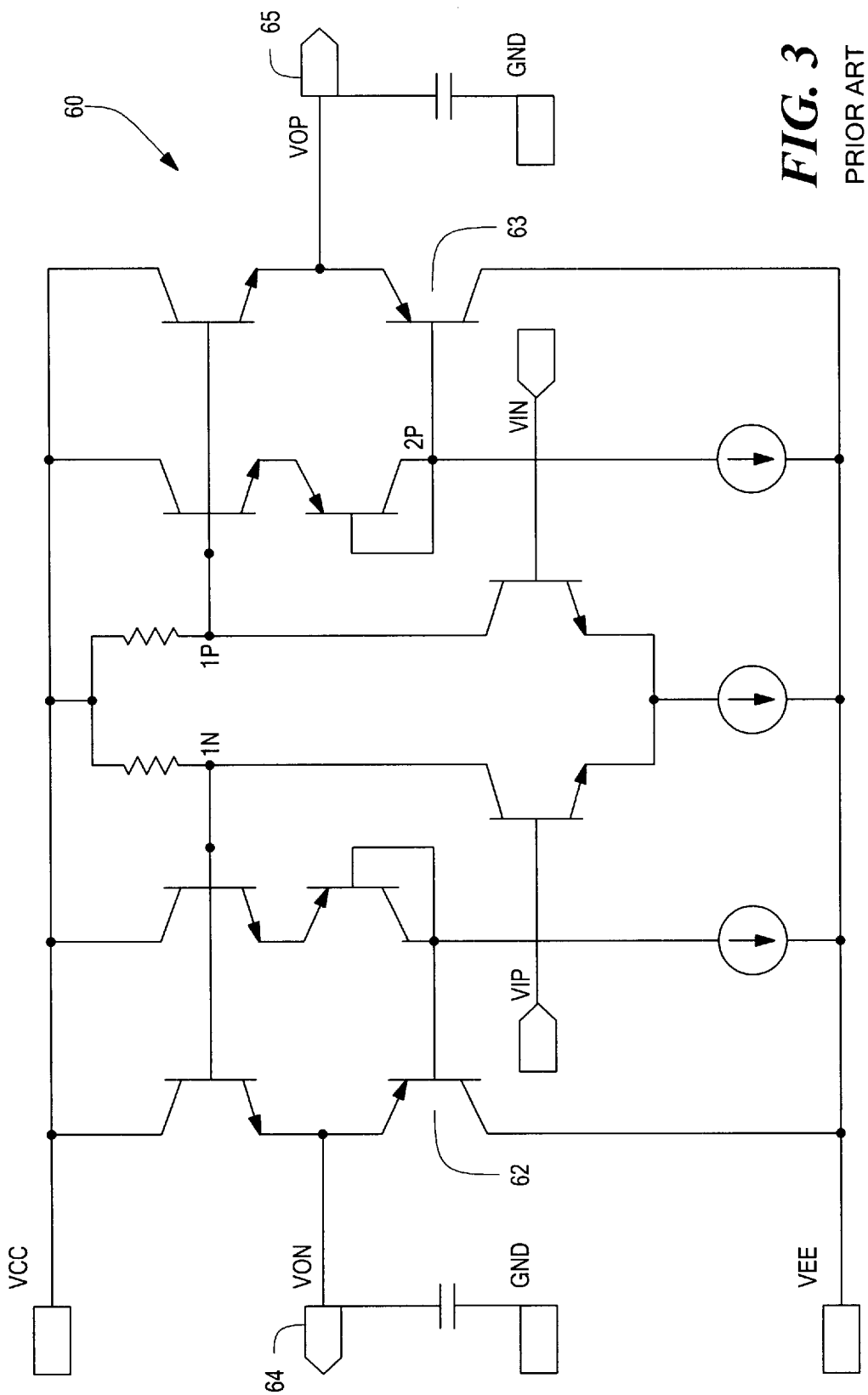
FIG. 3 is a schematic diagram of a second prior art emitter-coupled logic buffer.
Figure 4:
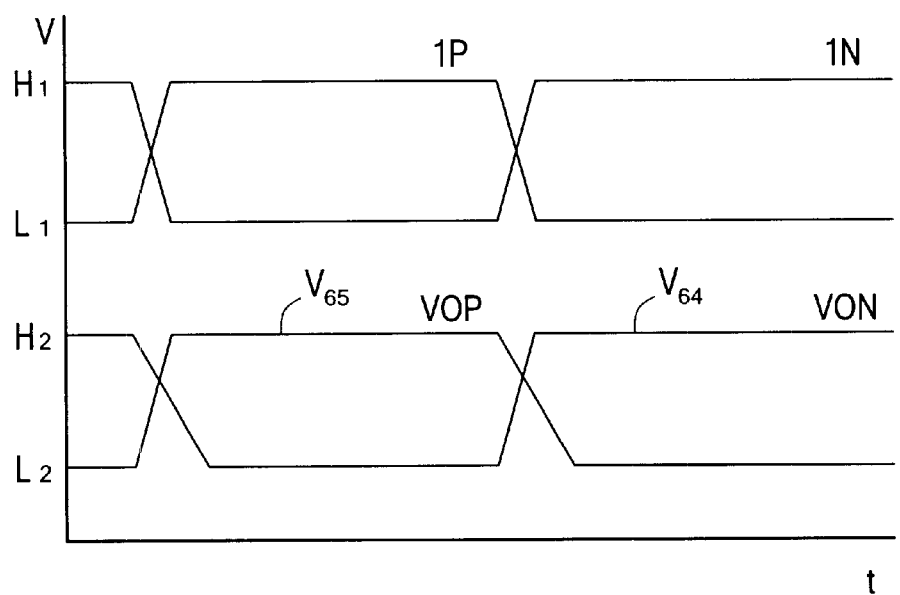
FIG. 4 is a graph that shows the voltages of the output terminals of the emitter-coupled logic buffer of FIG. 3.

Another prior art ECL inverter 60 is shown schematically in FIG. 3. In this inverter, PNP transistors 62 and 63 are used to actively discharge output terminals 64 and 65, respectively. The rising and falling edges of the output voltages, as shown in FIG. 4 of this system, are more symmetrical. However, while this system reduces current consumption by not using a current source for discharging the output terminals, the overall circuit requires additional transistors and the pull down PNP transistors, by their nature, require elaborate process steps to avoid being much slower than NPN transistors.

Figure 5:
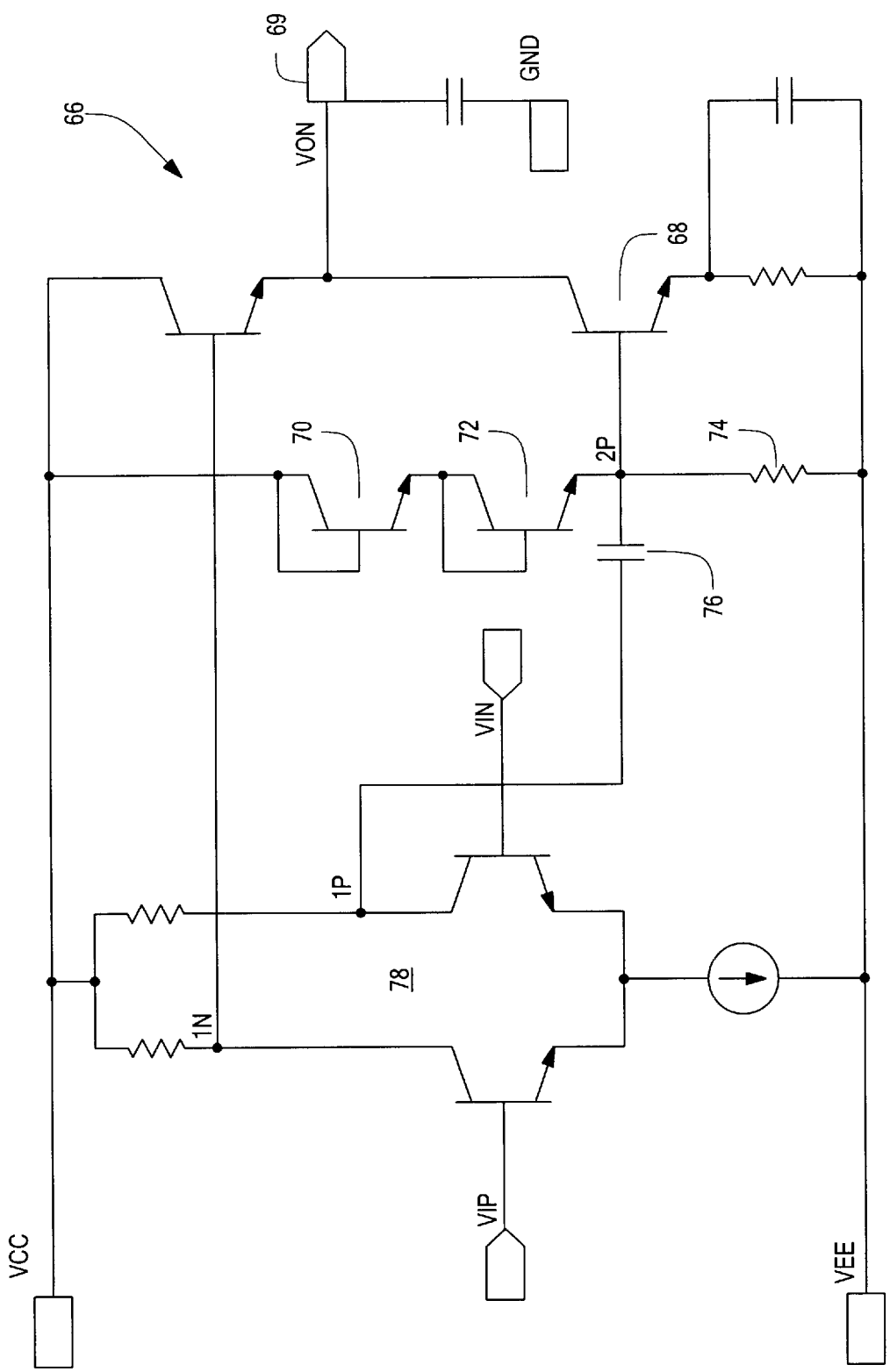
FIG. 5 is a schematic diagram of a third prior art emitter-coupled logic buffer.
Figure 6:
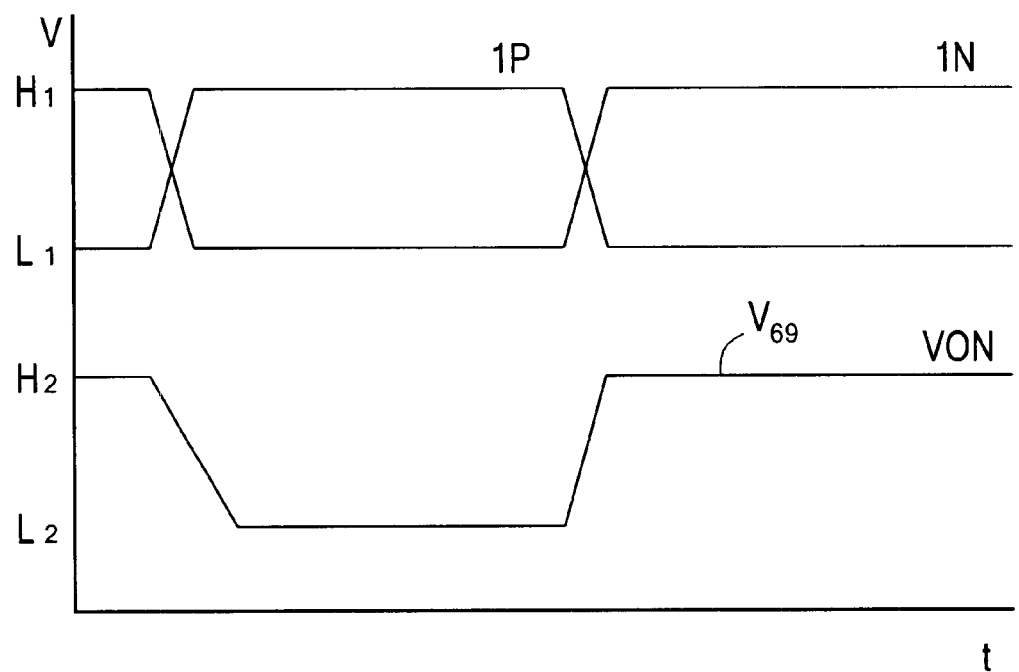
FIG. 6 is a graph that shows the output voltage of the emitter-coupled logic buffer of FIG. 5.

Yet another prior art ECL inverter 66 is shown schematically in FIG. 5. This system includes an NPN transistor 68 for actively pulling down the output terminal 69. Transistors 70 and 72 and resistor 74 are required to bias the transistor 68 with a small amount of current in order to allow the transistor 68 to operate in the intended manner. Furthermore, a capacitor 76 is required to couple transistor 68 to the input differential circuit 78. While this circuit, as shown schematically in FIG. 6, increases the symmetry between the rising and falling edges of the output voltage $V_{69}$, it has several disadvantages. One disadvantage of this circuit is the large area needed to implement the capacitors and the increased number of transistors required for proper operation of the circuit. Furthermore, because of the bias current requirement of the pull down transistor 68, the circuit must be properly tuned, further increasing the complexity of the circuit.

Figure 7:
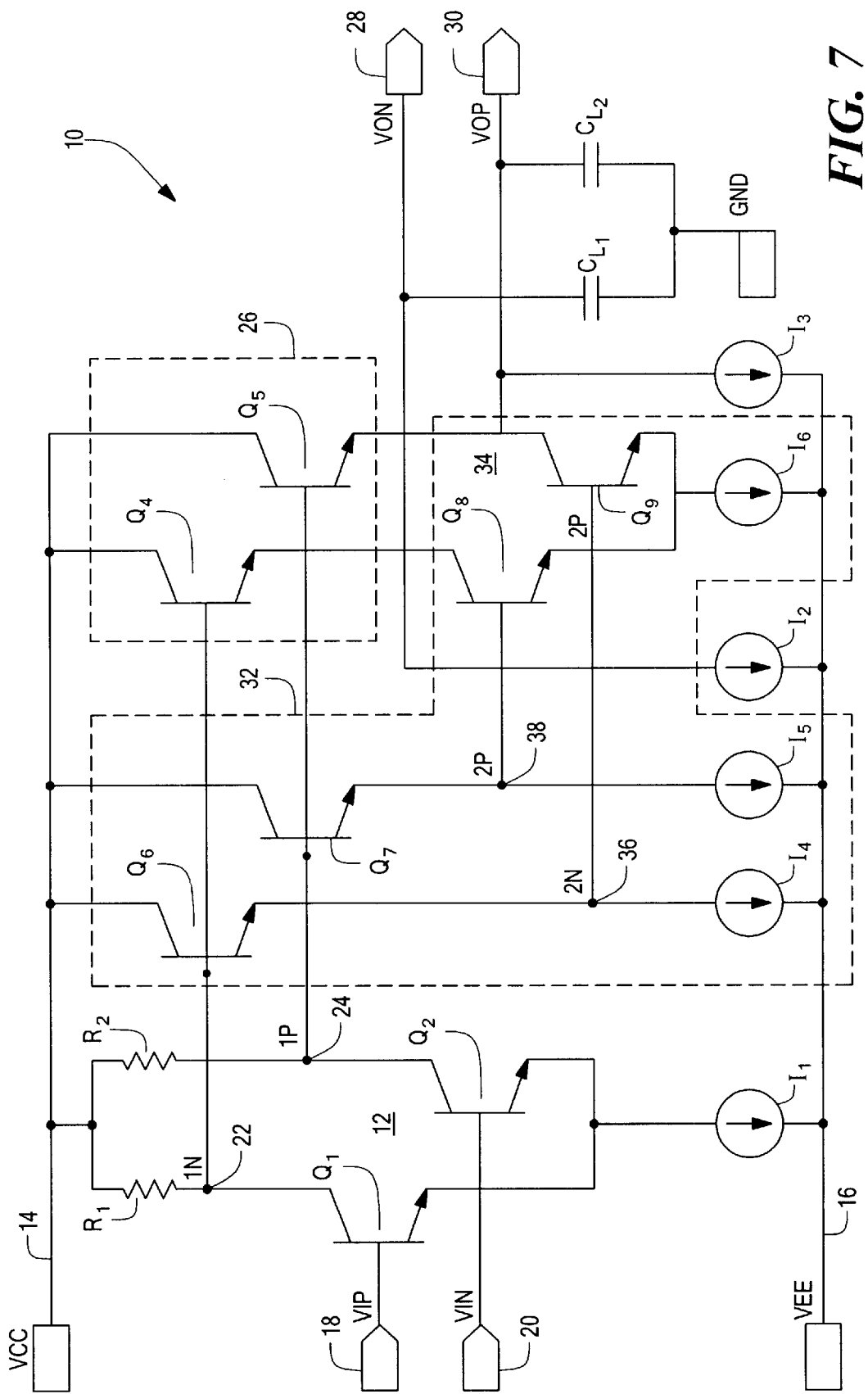
FIG. 7 is a schematic diagram of the emitter-coupled logic buffer in accordance with the present invention.

The emitter-coupled logic buffer 10, FIG. 7, of the present invention includes a logic gate such as differential device 12 coupled between a voltage source 14 and a reference voltage source 16 and which includes a first input terminal 18 and a second input terminal 20. A first transistor $Q_1$ has its base coupled to the input terminal 18 and its collector coupled to voltage source 14 through a resistor $R_1$. A second transistor $Q_2$ has its base coupled to the input terminal 20 and its collector coupled to the voltage source 14 through a resistor $R_2$. The emitters of transistors $Q_1$ and $Q_2$ are coupled together and to the reference voltage 16 through a current source $I_1$. Differential device 12 also includes differential output nodes 22 at the collector of transistor $Q_1$, and 24 at the collector of transistor $Q_2$.

Buffer 10 also includes a pull-up circuit 26, including a transistor $Q_4$ having its base coupled to output node 22 of differential device 12, its collector coupled to voltage source 14 and its emitter coupled to output terminal 28 having a capacitance $CL_1$ and to the reference voltage 16 through a current source $I_2$. Pull-up circuit 26 also includes a transistor $Q_5$ having its base coupled to output node 24 of differential device 12, its collector coupled to voltage source 14 and its emitter coupled to output terminal 30 having a capacitance $CL_2$ and to the reference voltage 16 through a current source $I_3$. Capacitances $CL_1$ and $CL_2$ may be either capacitances associated with a load connected to the output terminals 28 and 30 or parasitic capacitances associated with the output terminals 28 and 30.

Buffer 10 further includes a pull-down circuit 32, including a differential device 34 and transistors $Q_6$ and $Q_7$. Transistor $Q_6$ has its base coupled to output node 22 of differential device 12, its collector coupled to voltage source 14 and its emitter coupled to an internal node 36 of the pull-down circuit 32 and to the reference voltage 16 through a current source 14. Transistor $Q_7$ has its base coupled to output node 24 of differential device 12, its collector coupled to voltage source 14 and its emitter coupled to an internal node 38 of pull-down circuit 32 and to the reference voltage 16 through a current source $I_5$. Differential device 34 includes a transistor $Q_8$ having its base coupled to internal node 38 and its collector coupled to output node 28 and a transistor $Q_9$ having its base coupled to internal node 36 and its collector coupled to output node 30. The emitters of transistors $Q_8$ and $Q_9$ are coupled together and to the reference voltage 16 through a current source $I_6$. Current source $I_6$ has an amplitude that enables it to rapidly discharge the output terminals 28 and 30, as is described below. Current sources 12 and 13 are much smaller in amplitude than current source $I_6$, and operate to provide a small bias current to transistors $Q_4$ and $Q_5$, respectively, so that the transistor that is in the on state always has some current provided thereto to prevent a long tail in the output pulse response that can degrade the timing repeatability of the buffer 10.

The operation of buffer 10 is described with reference to FIG. 8, which is a graph showing the voltages $V_{22}$ and $V_{24}$ at output nodes 22 and 24, respectively, and the voltages $V_{28}$ and $V_{30}$ at output terminals 28 and 30, respectively. At a time $t_1$, the voltage $V_{22}$ at output node 22 is a logic high and the voltage $V_{24}$ at output node 24 is a logic low, the voltage $V_{28}$ at output terminal 28 is a logic high and the voltage $V_{30}$ at output terminal 30 is a logic low. As the voltages at the input terminals 18 and 20 switch states, the voltage $V_{22}$ at output node 22 transitions from a logic high to a logic low and the voltage $V_{24}$ at output node 24 transitions from a logic low to a logic high. This results in the transistor $Q_4$ of pull-up circuit 26 being turned off by the logic low at output node 22 and transistor $Q_5$ of pull-up circuit 26 being turned on by the logic high at output node 24. Accordingly, since transistor $Q_4$ is in the off state, output terminal 28 and its associated capacitive load $CL_1$ is no longer being charged and, because of the on state of transistor $Q_5$, output terminal 30 and its associated capacitive $CL_2$ are charged through the transistor $Q_5$. Furthermore, the logic low at output node 22 pulls down the base of transistor $Q_6$ of pull-down circuit 32, which results in internal node 36 being at a logic low. This causes transistor $Q_9$ to be in the off state which causes the output terminal 30 and capacitive load $CL_2$ to remain in its charged state. On the other hand, because of the logic high at output node 24, the base of transistor $Q_7$ of pull-down circuit 32 is pulled up, causing internal node 38 to be at a logic high, thereby turning on transistor $Q_8$. This allows output terminal 28 and its associated capacitive load $CL_1$ to be discharged through capacitor $Q_8$ and current source $I_6$. The resulting output voltages $V_{28}$ and $V_{30}$ are shown at time $t_2$ in FIG. 8.

At a time $t_3$, when the voltage $V_{22}$ at output node 22 is a logic low and a voltage $V_{24}$ at output node 24 is a logic high, the voltage $V_{28}$ at output terminal 28 is a logic low and the voltage $V_{30}$ at output terminal 30 is a logic high. As the voltages at the input terminals 18 and 20 transition to the opposite states, i.e. the voltage at input terminal 18 transitions from a logic high to a logic low and a voltage at input terminal 20 transitions from a logic low to logic high, the voltage $V_{22}$ at output node 22 transitions from a logic low to a logic high and the voltage $V_{24}$ at output node 24 transitions from a logic high to a logic low as shown in FIG. 8. The logic high at output node 22 turns on transistor $Q_4$ of pull-up circuit 26 and pulls up the base of transistor $Q_6$ of pull-down circuit 32. As a result of transistor $Q_4$ being turned on, output terminal 28 and its associated capacitive load $CL_1$ is charged to a logic high. Furthermore, internal node 36 of pull-down circuit 32 is raised to a logic high level, thus turning on transistor $Q_9$. This provides a discharge path for output terminal 30 and capacitive load $CL_2$, thereby discharging capacitive load $CL_2$ through transistor $Q_9$ and current source $I_6$.

Concurrently, the logic low level at output node 24 turns off transistor $Q_5$ of pull-up circuit 26 and pulls down the base of transistor $Q_7$ of pull-down circuit 32. As a result of being in an off state, transistor $Q_5$ prevents any charging current from reaching output terminal 30 and capacitive load $CL_2$. Furthermore, transistor $Q_7$ drives internal node 38 at a logic low, thereby turning off transistor $Q_8$, which isolates output terminal 28 and capacitive load $CL_1$ from the discharge path, thereby allowing output terminal 28 and capacitive load $CL_1$ to quickly reach the charged or logic high state as shown at time $t_4$ in FIG. 8.

Accordingly, the buffer 10 provides a single discharge path through current source 16 to discharge both output terminals 28 and 30 and their associated capacitive loads $CL_1$ and $CL_2$, respectively. Since the current source $I_6$ is the only discharge path, it can have an amplitude that enables it to cause the output terminals to be discharged at substantially the same rate that they are charged. As the pull-up circuit 26 alternately charges the output terminals 28 and 30, the differential device 34 of pull-down circuit 32 inversely alternately discharges the output terminals by alternately providing a discharge path through either transistor $Q_8$ and current source $I_6$ or through transistor $Q_9$ and current source $I_6$. It can therefore be seen that the buffer 10 provides output voltages having substantially symmetrical rising and falling edges, as shown in FIG. 8. Furthermore, no current is wasted in current source $I_6$ because it is always discharging one of the two output terminals.

Figure 8:
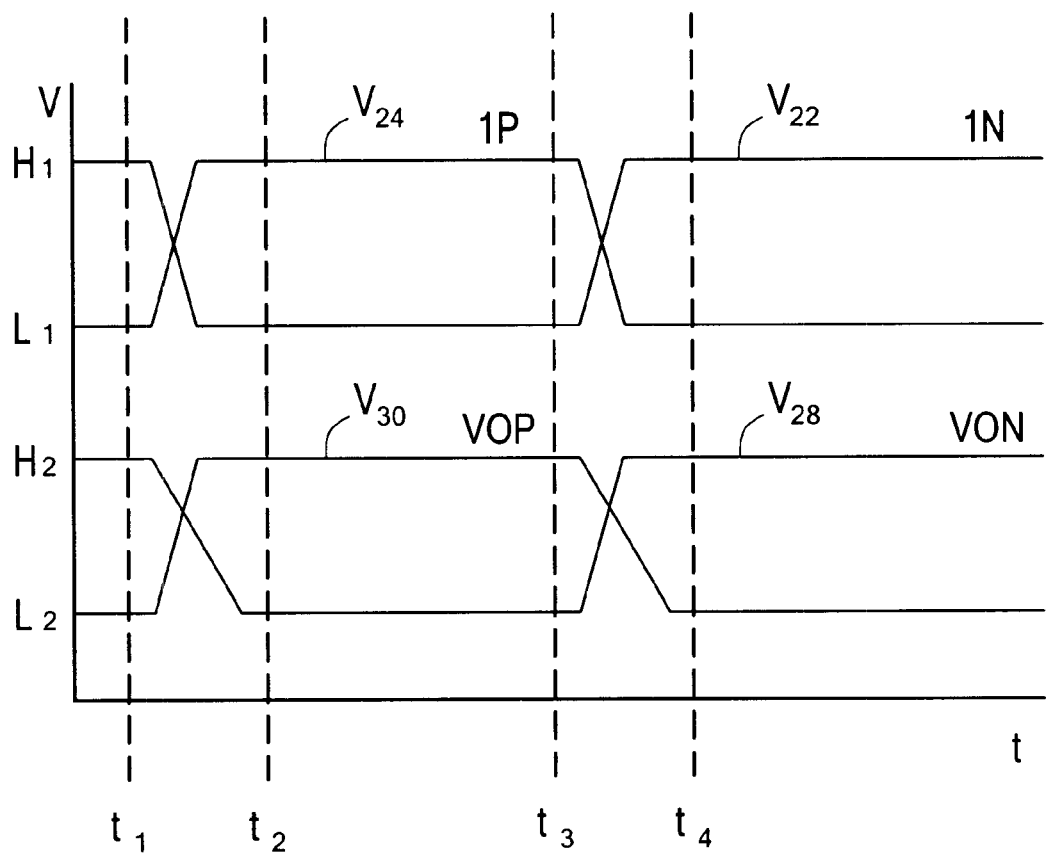
FIG. 8 is a graph that shows the voltages at output nodes and at the output terminals of the buffer of FIG. 7 in accordance with the present invention.
Figure 9:
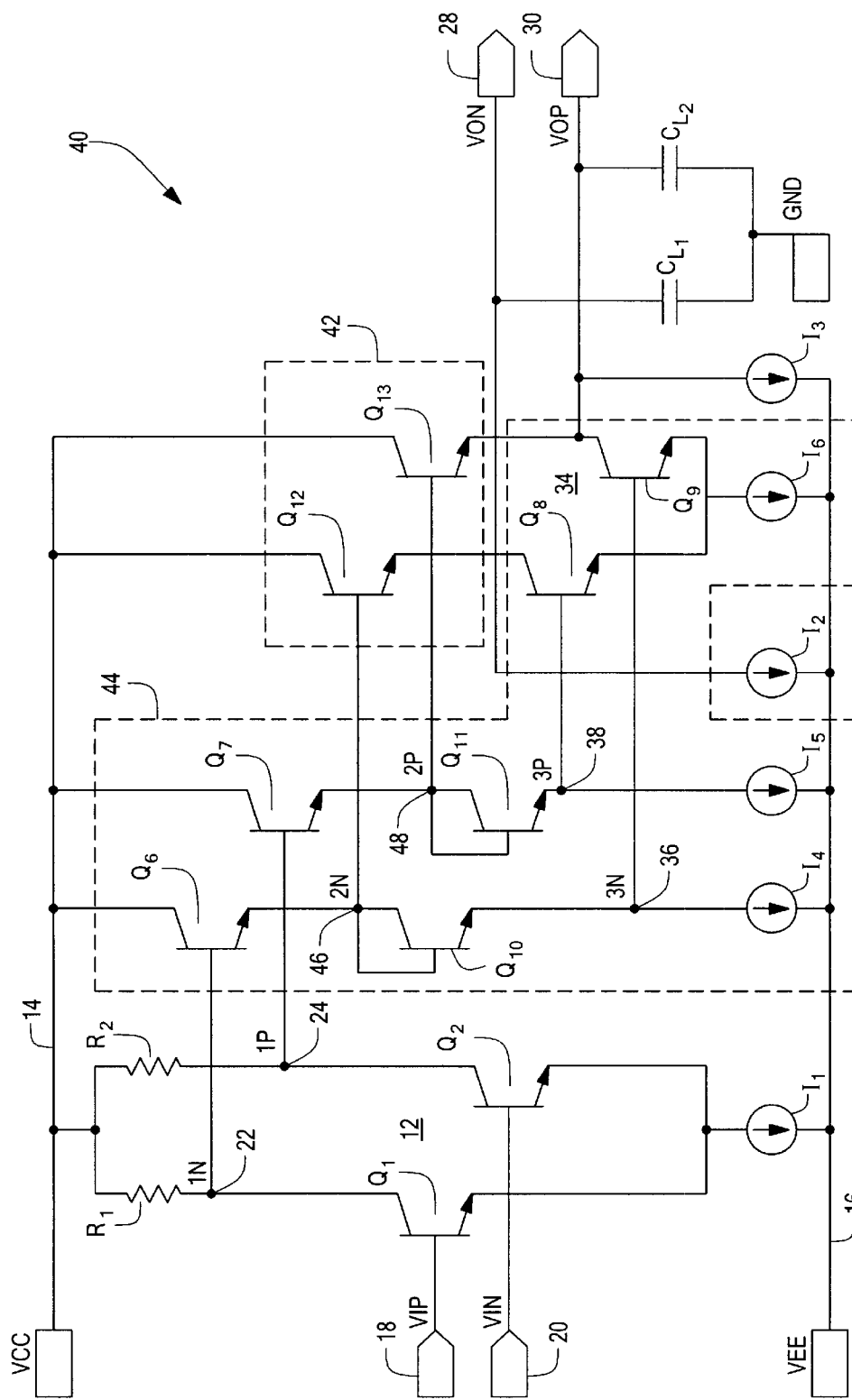
FIG. 9 is a schematic diagram of a second embodiment of the emitter-coupled logic buffer in accordance with the present invention.

A second embodiment of the emitter-coupled logic buffer of the present invention is shown at 40 in FIG. 9. In FIG. 9, like reference numerals are used to designate elements which are the same as those shown in FIG. 8. Buffer 40 includes a pull-up circuit 42 and a pull-down circuit 44 for charging and discharging the output terminals 28 and 30, respectively. Pull-down circuit 44 includes a transistor $Q_6$ having its base coupled to output node 22 of differential device 12 and its collector coupled to voltage source 14 and a transistor $Q_7$ having its base coupled to output node 24 of differential device 12 and its collector coupled to the voltage source 14. Pull-down circuit 44 further includes a transistor $Q_{10}$ connected as a level-shifting diode with its base coupled to its collector at internal node 46 and its emitter coupled to internal node 36 of pull-down circuit 44 and a transistor $Q_{11}$ connected as a level-shifting diode having its base coupled to its collector at internal node 48 and its emitter coupled to internal node 38 of pull-down circuit 44. The emitter of transistor $Q_6$ is coupled to internal node 46 and the emitter of transistor $Q_7$ is coupled to internal node 48. Pull-down circuit 44 also includes differential device 34 including transistor $Q_8$ having its base coupled to internal node 38, its collector coupled to output terminal 28 and its emitter coupled to the reference voltage $I_6$ through current source 16, and transistor $Q_9$ having its base coupled to input node 36, its collector coupled to output terminal 30 and its emitter coupled to the emitter of transistor $Q_8$ and to the reference voltage $I_6$ through current source $I_6$.

Pull-up circuit 42 includes a transistor $Q_{12}$ having its base coupled to internal node 46 of pull-down circuit 44, its collector coupled to the voltage source 14 and its emitter coupled to output terminal 28 and its associated capacitive load $CL_1$. Pull-up circuit 42 also includes a transistor $Q_{13}$ having its base coupled to internal node 48 of pull-down circuit 44, its collector coupled to voltage source 14 and its emitter coupled to output terminal 30 and its associated capacitive load $CL_2$.

The operation of buffer 40 will now be described with reference to FIG. 10. At time $t_1$, the voltage at input terminal 18 is at a logic low and the voltage at input terminal 20 is at a logic high, the voltage $V_{22}$ at node 22 is at a logic high and the voltage $V_{24}$ at output node 24 is at a logic low. The logic high at output node 22 turns on transistor $Q_6$, which causes the internal node 46 to be brought to a logic high level. This causes transistor $Q_{12}$ of pull-up circuit 42 to be turned on, thereby causing the output terminal 28 and capacitive load $CL_1$ to be charged to a logic high through transistor $Q_{12}$. Since the internal node 46 is at a logic high, internal node 36 is also at a logic high (although 1 $V_{BE}$ drop below the voltage at internal node 46) thereby causing transistor $Q_9$ of differential device 34 to be turned on to provide a discharge path through transistor $Q_9$ and current source $I_6$ for the discharge of output terminal 30 and capacitive load $CL_2$.

Concurrently, the voltage $V_{24}$ at output node 24 is at a logic low, causing the base and emitter of transistor $Q_7$ to be low, thereby causing the voltage at internal node 48 to be at a logic low. This causes transistor $Q_{13}$ of pull-up circuit 42 to be in an off state, thus preventing any charging current from reaching output terminal 30. Since the internal node 48 of pull-down circuit 44 is at a logic low level, internal node 38 is also at a logic low level (although 1 $V_{BE}$ drop below the voltage at internal node 48), causing transistor $Q_8$ to be an off state, thereby preventing any discharging of the output terminal 28 and capacitive load $CL_1$.

Figure 10:
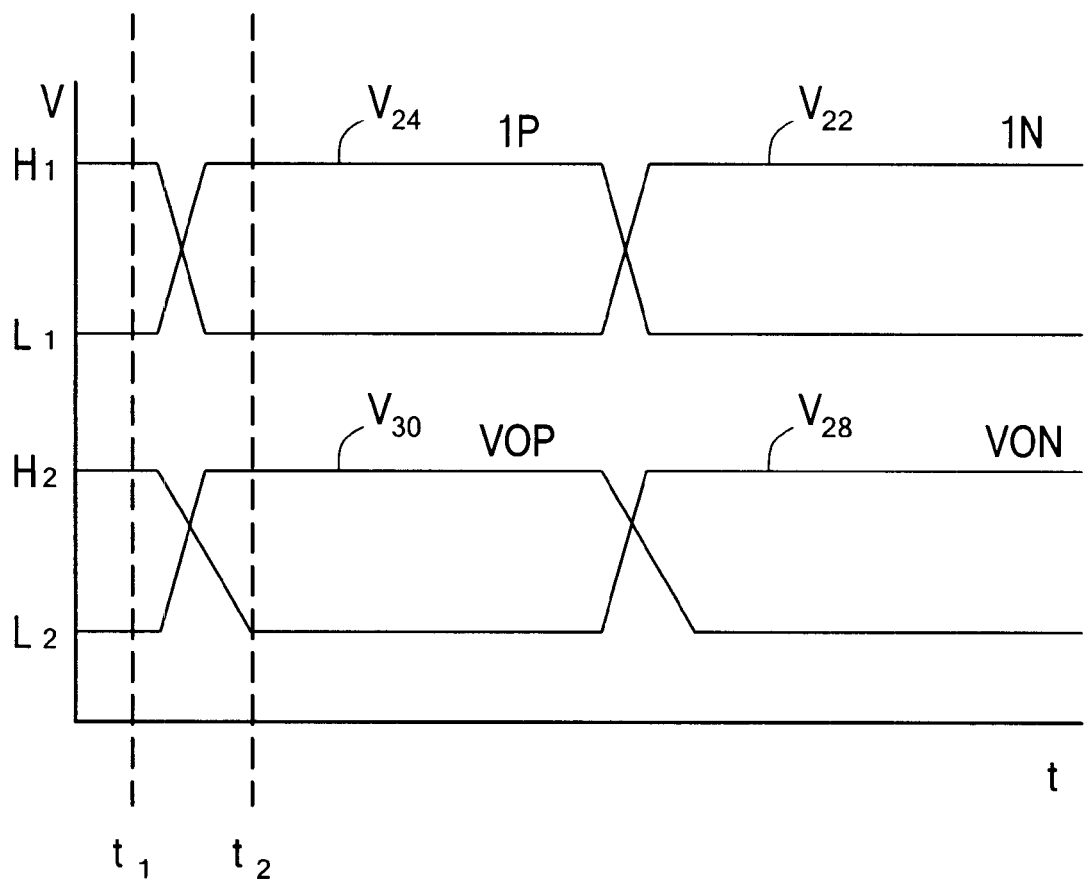
FIG. 10 is a graph that shows the voltages of the output nodes and output terminals of the buffer of FIG. 9 in accordance with the present invention.

After the differential input at input terminals 18 and 20 have transitioned to their opposite states, at time $t_2$ in FIG. 10, the voltage $V_{22}$ at node 22 of differential device 12 is at a logic low and the voltage $V_{24}$ at output node 24 is at a logic high. This causes the emitter of transistor $Q_6$ of pull-down circuit 44 to be low and the emitter of transistor $Q_7$ to be high. Accordingly, internal nodes 46 and 36 are at logic low levels and internal nodes 48 and 38 are at logic high levels. Therefore, transistor $Q_{12}$ of pull-up circuit 42 is in the off state, thereby preventing any charging current from reaching the output terminal 28 and capacitive load $CL_1$. Transistor $Q_8$ of pull-down circuit 44 is in the on state, thereby providing a discharge path for output terminal 28 and capacitive load $CL_1$ through transistor $Q_8$ and current source $I_6$. Furthermore, because of the logic high at internal node 48, transistor $Q_{13}$ of pull-up circuit 42 is in the on state and output terminal 30 and capacitive load $CL_1$ are charged through transistor $Q_{13}$. Due to the logic low at internal node 36, transistor $Q_9$ of pull-down circuit 44 is in the off state, thereby preventing any discharge of output terminal 30 and capacitive load $CL_2$.

In this embodiment, the addition of transistors $Q_6$ and $Q_7$ operate to reduce loading at output nodes 22 and 24 of differential device 12 as compared to the embodiment of FIG. 8. In other words, since only transistors $Q_6$ and $Q_7$ are coupled to output node 22 and 24, the capacitances at the output nodes 22 and 24 are reduced. Furthermore, transistors $Q_{10}$ and $Q_{11}$ operate to add an additional $V_{BE}$ drop at the bases of transistors $Q_8$ and $Q_9$, thereby reducing the possibility of saturating transistors $Q_8$ and $Q_9$.

While the invention is described as including bipolar transistors, it will be understood that any type of transistor, such as a field effect transistor, may be used in the buffer circuit of the present invention.

Accordingly, the present invention provides an emitter-coupled logic buffer which reduces power dissipation due to the use of only one current source for discharging differential output terminals and which reduces the discharge times of the output loads. The buffer of the present invention eliminates the need for fast complementary devices, such as PNP transistors, and reduces the number of transistors needed as compared to prior art buffers.

Although specific features of the invention are shown in some drawings and not in others, this is for convenience only as each feature may be combined with any or all of the other features in accordance with the invention.

Other embodiments will occur to those skilled in the art and are within the following claims:

What is claimed is:

1. A logic buffer comprising:
   a logic gate having at least two input terminals and two output nodes;
   at least first and second output terminals, each having a capacitance associated therewith;
   a pull-up circuit interconnected between each output node and said plurality of output terminals for alternately charging said capacitance; and
   a differential pull-down circuit including a common pull-down current source, said pull-down circuit interconnected between said output nodes and said output terminals for inversely alternately discharging said capacitances through the common pull-down current source for accelerating the discharge of the capacitance of the respective output terminal, said differential pull-down circuit further including:
      third and fourth emitter-coupled pull-down transistors, said third emitter-coupled pull-down transistor being electrically connected to said first output terminal for discharging the capacitance of said first output terminal, said fourth emitter-coupled pull-down transistor being electrically connected to said second output terminal for discharging the capacitance of said second output terminal, the emitters of said third and fourth emitter-coupled pull-down transistors being electrically connected to a reference voltage source through the common pull-down current source, said differential pull-down circuit further including a differential device having an input voltage and an output voltage wherein said output voltage is lower than said input voltage; and
      a fifth transistor electrically connected to said first output node and electrically connected directly by at least one non-active element to said third emitter-coupled pull-down transistor for controlling the state of said first emitter-coupled pull-down transistor, and a sixth transistor electrically connected to said second output node and electrically connected directly by at least one non-active element to said fourth emitter-coupled pull-down transistor for controlling the state of said fourth emitter-coupled pull-down transistor.

2. The logic buffer of claim 1 wherein said differential pull-down circuit includes a plurality of emitter-coupled transistors, each being electrically connected to one of said plurality of output terminals, the emitters of each of said transistors being electrically connected to a common pull down source.

3. The logic buffer of claim 1, said buffer including first and second output terminals, wherein said logic gate includes a differential device having first and second differential input terminals and first and second differential output nodes.

4. The logic buffer of claim 3 wherein said pull-up circuit includes a first transistor electrically connected between said first output node and said first output terminal for charging the capacitance of said first output terminal, and a second transistor electrically connected between said second output node and said second output terminal, for charging the capacitance of said second output terminal.

5. The logic buffer of claim 4 wherein a base terminal of said first transistor is electrically connected to an emitter terminal of said fifth transistor and a base terminal of said second transistor is electrically connected to an emitter terminal of said sixth transistor.

6. The logic buffer of claim 2 wherein said common pull-down current source is a fixed current source.

7. The logic buffer of claim 1 wherein said differential pull-down circuit includes a plurality of semiconductor switches, each having a control terminal, a first terminal and a second terminal, each of said semiconductor switches being electrically connected to one of said plurality of output terminals, the second terminals of each of said semiconductor switches being electrically connected to a common pull-down current source.

8. The logic buffer of claim 3 wherein said pull-up circuit includes a first semiconductor switch electrically connected between said first output node and said first output terminal for charging the capacitance of said first output terminal, and a second semiconductor switch electrically connected between said second output node and said second output terminal, for charging the capacitance of said second output terminal.

9. The logic buffer of claim 8 wherein a control terminal of said first semiconductor switch is electrically connected to a terminal of said fifth semiconductor switch and a control terminal of said second semiconductor switch is electrically connected to a terminal of said sixth semiconductor switch.

10. The logic buffer of claim 1 wherein each of said capacitances are associated with a load coupled to each of said plurality of output terminals.

11. The logic buffer of claim 1 wherein each of said capacitances are associated with parasitic loads at each of said plurality of output terminals.

12. A logic buffer comprising:
  a logic gate having at least two input terminals and two output nodes;
  a plurality of output terminals, each having a capacitance associated therewith;
  a pull-up circuit electrically connected between each of said output nodes and said plurality of output terminals for selectively charging the capacitance of each output terminal; and
  a pull-down circuit electrically connected between each of said output nodes and said plurality of output terminals for selectively discharging the capacitances of each of said output terminals through a single discharge path and;
  wherein said pull-up circuit and said pull-down circuit cooperate to alternately charge and discharge the capacitances of each of said output terminals, said differential pull-down circuit including a differential device having an input voltage and an output voltage with said output voltage being lower than said input voltage, said differential pull-down circuit further including:
    third and fourth emitter-coupled transistors, the emitters of said third and fourth transistors being electrically connected to a reference voltage source through the single discharge path; and
    a fifth transistor electrically connected to said first output node and electrically connected directly by at least one non-active element to said fourth transistor for controlling the state of said fourth transistor, and a sixth transistor electrically connected to said second output node and electrically connected directly by at least one non-active element to said third transistor for controlling the state of said third transistor.

13. The logic buffer of claim 12 wherein said pull-down circuit includes a plurality of emitter-coupled transistors, each transistor being electrically connected to one of said plurality of output terminals, the emitters of each of said transistors being electrically connected to said single discharge path.

14. The logic buffer of claim 13 wherein said single discharge path includes a fixed current source.

15. The logic buffer of claim 14, said buffer including first and second output terminals, wherein said logic gate includes a differential device having first and second differential input terminals and first and second differential output nodes.

16. The logic buffer of claim 15 wherein said pull-up circuit includes a first transistor electrically connected between said first output node and said first output terminal for charging the capacitance of said first output terminal, and a second transistor electrically connected between said second output node and said second output terminal, for charging the capacitance of said second output terminal.

17. The emitter-coupled logic buffer of claim 16 wherein a base terminal of said first transistor is electrically connected to an emitter terminal of said fifth transistor and a base terminal of said second transistor is electrically connected to an emitter terminal of said sixth transistor.

18. The logic buffer of claim 12 wherein each of said capacitances are associated with a load coupled to each of said plurality of output terminals.

19. The logic buffer of claim 12 wherein each of said capacitances are associated with parasitic loads at each of said plurality of output terminals.

20. A logic buffer comprising:
  a logic gate having at least two input terminals and two output nodes, said logic gate including a differential device having first and second differential input terminals and first and second differential output nodes;
  a plurality of output terminals, each having a capacitance associated therewith, said plurality of output terminals including at least a first and a second output terminal;
  a pull-up circuit interconnected between each output node and said plurality of output terminals for alternately charging said capacitance, said pull-up circuit including a first transistor electrically connected between said first output node and said first output terminal for charging the capacitance of said first output terminal, and a second transistor electrically connected between said second output node and said second output terminal, for charging the capacitance of said second output terminal; and
  a differential pull-down circuit including a pull-down current source, said pull-down circuit interconnected between said output nodes and said output terminals for inversely alternately discharging said capacitances through the pull-down current source for accelerating the discharge of the capacitance of the respective output terminal, said differential pull-down circuit further including:

third and fourth emitter-coupled transistors, said third transistor being electrically connected to said first output terminal for discharging the capacitance of said first output terminal, and said fourth transistor being electrically connected to said second output terminal for discharging the capacitance of said second output terminal, the emitters of said third and fourth transistors being electrically connected to a reference voltage source through the common pull-down current source;

a fifth transistor electrically connected between said first output node and said fourth transistor, for controlling the state of said fourth transistor, and a sixth transistor electrically connected between said second output node and said third transistor, for controlling the state of said third transistor;

a first diode electrically connected between said fourth and fifth transistors and a second diode electrically connected between said third and sixth transistors;

wherein a base terminal of said first transistor is electrically connected to an emitter terminal of said fifth transistor and a base terminal of said second transistor is electrically connected to an emitter terminal of said sixth transistor.

21. A logic buffer comprising:

a logic gate having at least two input terminals and two output nodes, said logic gate including a differential device having first and second differential input terminals and first and second differential output nodes;

a plurality of output terminals, each having a capacitance associated therewith, said plurality of output terminals including at least a first and a second output terminal;

a pull-up circuit interconnected between each output node and said plurality of output terminals for alternately charging said capacitance, said pull-up circuit including a first semiconductor switch electrically connected between said first output node and said first output terminal for charging the capacitance of said first output terminal, and a second semiconductor switch electrically connected between said second output node and said second output terminal, for charging the capacitance of said second output terminal; and a differential pull-down circuit including a pull-down current source, said pull-down circuit interconnected between said output nodes and said output terminals for inversely alternately discharging said capacitance through the pull-down current source for accelerating the discharge of the capacitance of the respective output terminal, said differential pull-down circuit further including:

third and fourth semiconductor switches, each having first and second terminals, said third semiconductor switch having its first terminal electrically connected to said first output terminal for discharging the capacitance of said first output terminal, and said fourth semiconductor switch having its first terminal electrically connected to said second output terminal for discharging the capacitance of said second output terminal, the second terminals of said third and fourth semiconductor switches being electrically connected together and to a reference voltage source through the common pull-down current source;

a fifth semiconductor switch electrically connected between said first output node and said fourth semiconductor switch, for controlling the state of said fourth semiconductor switch, and a sixth semiconductor switch electrically connected between said second output node and said third semiconductor switch, for controlling the state of said third semiconductor switch;

a first diode electrically connected between said fourth and fifth semiconductor switches and a second diode electrically connected between said third and sixth semiconductor switches;

wherein a control terminal of said first semiconductor switch is electrically connected to a terminal of said fifth semiconductor switch and a control terminal of said second semiconductor switch is electrically connected to a terminal of said sixth semiconductor switch.

22. A logic buffer comprising:

a logic gate having at least two input terminals and two output nodes, said logic gate including a differential device having first and second differential input terminals and first and second differential output nodes;

a plurality of output terminals, each having a capacitance associated therewith, said plurality of output terminals including at least a first and a second output terminal;

a pull-up circuit electrically connected between each of said output nodes and said plurality of output terminals for selectively charging the capacitance of each output terminal, said pull-up circuit including a first transistor electrically connected between said first output node and said first output terminal for charging the capacitance of said first output terminal, and a second transistor electrically connected between said second output node and said second output terminal, for charging the capacitance of said second output terminal; and a pull-down circuit electrically connected between each of said output nodes and said plurality of output terminals for selectively discharging the capacitance of each of said output terminals through a single discharge path, said pull-down circuit including a plurality of emitter-coupled transistors, each transistor being electrically connected to one of said plurality of output terminals, the emitters of each of said transistors being electrically connected to said single discharge path, said single discharge path including a fixed current source, said pull-down circuit further including:

third and fourth emitter-coupled transistors, said third transistor being electrically connected to said first output terminal for discharging the capacitance of said first output terminal, and said fourth transistor being electrically connected to said second output terminal for discharging the capacitance of said second output terminal, the emitters of said third and fourth transistors being electrically connected to a reference voltage source through the single discharge path;

a fifth transistor electrically connected between said first output node and said fourth transistor, for controlling the state of said fourth transistor, and a sixth transistor electrically connected between said second output node and said third transistor, for controlling the state of said third transistor;

a first diode electrically connected between said fourth and fifth transistors and a second diode electrically connected between said third and sixth transistors;

wherein said pull-up circuit and said pull-down circuit cooperate to alternately charge and discharge the capacitance of each of said output terminals and a base terminal of said first transistor is electrically connected to the emitter terminal of said fifth transistor and a base terminal of said second transistor is electrically connected to an emitter terminal of said sixth transistor.

23. The logic buffer of claim 22 wherein each of said capacitances are associated with a load coupled to each of said plurality of output terminals.

24. The logic buffer of claim 22 wherein each of said capacitances are associated with parasitic loads at each of said plurality of output terminals.

25. A logic buffer comprising:
a logic gate having at least two input terminals and two output nodes, said logic gate including a differential device having first and second differential input terminals and first and second differential output nodes;
a plurality of output terminals, each having a capacitance associated therewith, said plurality of output terminals including at least a first and a second output terminal;
a pull-up circuit interconnected between each output node and said plurality of output terminals for alternately charging said capacitance, said pull-up circuit including a first transistor electrically connected between said first output node and said first output terminal for charging the capacitance of said first output terminal, and a second transistor electrically connected between said second output node and said second output terminal, for charging the capacitance of said second output terminal; and
a differential pull-down circuit including a common pull-down current source, said common pull-down circuit interconnected between said output nodes and said output terminals for inversely alternately discharging said capacitance through the pull-down current source for accelerating the discharge of the capacitance of the respective output terminal, said differential pull-down circuit further including:
third and fourth emitter-coupled transistors, said third transistor being electrically connected to said first output terminal for discharging the capacitance of said first output terminal, and said fourth transistor being electrically connected to said second output terminal for discharging the capacitance of said second output terminal, the emitters of said third and fourth transistors being electrically connected to a reference voltage source through the common pull-down current source; and
a fifth transistor electrically connected between said first output node and said fourth transistor, for controlling the state of said fourth transistor, and a sixth transistor electrically connected between said second output node and said third transistor, for controlling the state of said third transistor, wherein there is a level shift from the first output node through the pull-down circuit and to the base of the fourth transistor and a level shift from the second output node through the pull-down circuit and to the base of the third transistor wherein said level shifts are less than $2V_{BE}$;
wherein a base terminal of said first transistor is electrically connected to a base terminal of said fifth transistor and a base terminal of said second transistor is electrically connected to a base terminal of said sixth transistor.

26. A logic buffer comprising:
a logic gate having at least two input terminals and two output nodes, said logic gate includes a differential device having first and second differential input terminals and first and second differential output nodes;
a plurality of output terminals, each having a capacitance associated therewith, said plurality of output terminals including at least a first and a second output terminal;
a pull-up circuit electrically connected between each of said output nodes and said plurality of output terminals for selectively charging the capacitance of each output terminal, said pull-up circuit including a first transistor electrically connected between said first output node and said first output terminal for charging the capacitance of said first output terminal, and a second transistor electrically connected between said second output node and said second output terminal, for charging the capacitance of said second output terminal; and
a pull-down circuit electrically connected between each of said output nodes and said plurality of output terminals for selectively discharging the capacitance of each of said output terminals through a single discharge path, said pull-down circuit including a plurality of emitter-coupled transistors, each transistor being electrically connected to one of said plurality of output terminals, the emitters of each of said transistors being electrically connected to said single discharge path, said single discharge path including a fixed current source, said pull-down circuit further including:
third and fourth emitter-coupled transistors, said third transistor being electrically connected to said first output terminal for discharging the capacitance of said first output terminal, and said fourth transistor being electrically connected to said second output terminal for discharging the capacitance of said second output terminal, the emitters of said third and fourth transistors being electrically connected to a reference voltage source through the single discharge path;
a fifth transistor electrically connected between said first output node and said fourth transistor, for controlling the state of said fourth transistor, and a sixth transistor electrically connected between said second output node and said third transistor, for controlling the state of said third transistor, wherein there is a level shift from the first output node through the pull-down circuit and to the base of the fourth transistor and a level shift from the second output node through the pull-down circuit and to the base of the third transistor wherein said level shifts are less than $2V_{BE}$;
wherein said pull-up circuit and said pull-down circuit cooperate to alternately charge and discharge the capacitance of each of said output terminals and a base terminal of said first transistor is electrically connected to a base terminal of said fifth transistor and a base terminal of said second transistor is electrically connected to a base terminal of said sixth transistor.

* * * * *